(12) United States Patent
Jain et al.

(10) Patent No.: US 6,998,935 B2
(45) Date of Patent: Feb. 14, 2006

(54) SWITCH MATRIX

(75) Inventors: Nitin Jain, San Diego, CA (US); Jean-Pierre Lanteri, Waltham, MA (US); Noyan Kinayman, Malden, MA (US)

(73) Assignee: M/A-Com, Inc., Lowell, MA (US)

( * ) Notice: Subject to any disclaimer, the term of this patent is extended or adjusted under 35 U.S.C. 154(b) by 18 days.

(21) Appl. No.: 10/369,434

(22) Filed: Feb. 19, 2003

(65) Prior Publication Data

US 2004/0160290 A1  Aug. 19, 2004

(51) Int. Cl.
*H01P 1/10* (2006.01)
(52) U.S. Cl. .................................... 333/104; 333/101
(58) Field of Classification Search ........ 333/101–107, 333/17.1
See application file for complete search history.

(56) References Cited

U.S. PATENT DOCUMENTS

| | | | | |
|---|---|---|---|---|
| 4,983,865 A | * | 1/1991 | Ho et al. | 327/404 |
| 5,073,775 A | | 12/1991 | Hofmann | 340/825.79 |
| 6,265,953 B1 | * | 7/2001 | Romano | 333/101 |
| 6,737,958 B1 | * | 5/2004 | Satyanarayana | 340/14.1 |

FOREIGN PATENT DOCUMENTS

| | | |
|---|---|---|
| EP | 0 755 093 A1 | 1/1997 |
| EP | 1 162 683 A2 | 12/2001 |
| EP | 1 162 683 A3 | 12/2001 |

* cited by examiner

*Primary Examiner*—Timothy P. Callahan
*Assistant Examiner*—Cassandra Cox

(57) ABSTRACT

A switch matrix including a plurality of microstrip pairs arranged to form a grid and switches to couple the microstrip pairs where they cross. Each microstrip pair includes a first microstrip and a second microstrip for passing signals. The signals on the first and second microstrips are such that the electromagnetic forces produced by each one are canceled out by the other. By canceling out the electromagnetic forces, undesirable coupling between microstrips that cross and between microstrips and the substrate are minimized, thereby allowing inexpensive substrates such as silicon to be used.

35 Claims, 13 Drawing Sheets

SWITCH MATRIX

FIELD OF THE INVENTION

The present invention relates to the field of electronics and, more particularly, to switch matrices used in electronics to route electrical signals.

BACKGROUND OF THE INVENTION

Switch matrices are commonly used in the field of electronics to route electrical signals. FIG. 1 depicts a prior art switch matrix 100. The switch matrix 100 includes a plurality of overlapping microstrips 102a–102p arranged to form a grid. The microstrips are conductive lines fabricated on a semiconductor substrate 104, which is typically GaAs to minimize signal losses. At their cross points, i.e., the points where horizontal microstrips 102a–h cross vertical microstrips 102i–p, the microstrips are electrically isolated from one another. A switch (represented by the diode symbol in FIG. 1), e.g., switch 106, is present at each cross point to couple the microstrips that intersect at that cross point.

Each switch can either be open (i.e., prevent an electrical connection from being made through the switch) or closed (i.e., permit an electrical connection to be made through the switch). By using a controller 110 to control which of the switches are open and which of the switches are closed, the switch matrix 100 can be used to route electrical signals. For example, if an input electrical signal is present on horizontal microstrip 102a and only the switch 106 in the upper left hand corner of the switch matrix 100 is closed, the input electrical signal is passed to vertical microstrip 102i. If only the switch 108 in the upper right hand corner of the switch matrix 100 is closed, the input electrical signal is passed to vertical microstrip 102p. Closing of multiple switches will allow the input electrical signal to be passed to multiple microstrips.

A known switch commonly used in prior art switch matrices is a PNPN latching device. The PNPN latching device is coupled between a horizontal microstrip and a vertical microstrip and includes a biasing port for receiving a typical biasing current. The PNPN latching device is closed by applying a large differential voltage across the device. For example, if switch 106 is a PNPN latching device, switch 106 may be closed by supplying a positive voltage, e.g., greater than 10 V, to horizontal microstrip 102a and a negative voltage, e.g., less than –10 V, to vertical microstrip 102i. Once the PNPN latching device is closed, the PNPN latching device will remain closed as long as a relatively small biasing current is passing through the PNPN latching device. The PNPN latching device may be opened by removing this biasing current, thereby uncoupling microstrips 102a and 102i. This switching action is due to the inherent hysteresis of the PNPN device, which is well known to those skilled in the art.

Switch matrices of this type have four significant limitations. First, when high frequency signals, e.g., in the Gigahertz range, are passing through one or more of the microstrips 102a–102p, excessive coupling occurs between the microstrips at the cross points. For example, in a typical switch matrix using 25 micrometer wide microstrips over a 100 micrometer deep GaAs substrate, isolation can be less than –20 dB at 25 Gigahertz. Attempting to decrease the coupling by reducing the width of the transmission lines, results in increased insertion losses. Second, the GaAs substrates that are typically used in switch matrices to minimize signal losses are relatively expensive as compared to silicon substrates. Third, the PNPN latching devices that are commonly used are difficult to design and produce, leading to relatively high fabrication costs. Finally, due to size and yield restrictions, it is difficult to incorporate amplifiers into the switch matrix to amplify the RF signal.

Accordingly, there is a need for switch matrices with improved isolation that are easier to design and inexpensive to produce. The present invention fulfills this need among others.

SUMMARY OF THE INVENTION

The present invention is a switch matrix that uses multiple sets of microstrip pairs deposited on a semiconductor substrate. The microstrip pairs are arranged such that a first set of microstrip pairs crosses a second set of microstrip pairs. Each microstrip pair includes a pair of metal strips parallel to each other and separated by a narrow gap. The width and separation of the lines are calculated according to the desired characteristic impedance. A switch assembly is present at each cross point to couple the microstrip pairs that intersect at that cross point when the switch assembly is closed. When the switch assembly is closed, one microstrip of a first microstrip pair is coupled to one microstrip of a second microstrip pair and the other microstrip of the first microstrip pair is coupled to the other microstrip of the second microstrip pair. A control individually controls the switch assemblies to couple microstrip pairs together as desired. When passing data signals, the signals on a pair of microstrips are preferably balanced such that the electromagnetic fields produced by each of the microstrips at a midpoint between the microstrips are canceled by the electromagnetic fields produced by the other to create a virtual ground at the midpoint. The electromagnetic fields produced by a balanced microstrip pair are concentrated primarily in the vicinity of a circular region centered around the midpoint between the two microstrips of the microstrip pair and perpendicular to the longitudinal axes of the microstrips, rather than being concentrated into the semiconductor substrate as in conventional unbalanced microstrips. Thus, increased isolation is achieved between the microstrip pair and the semiconductor substrate, which minimizes losses due to the semiconductor substrate. Due to lower losses attributed to the semiconductor substrate, inexpensive semiconductor substrates such as silicon may be used, which, in turn, enables the use of conventional MOS transistors or Bipolar transistors as switching elements instead of PNPN latching devices. Accordingly, reduced production costs are achievable. In addition, the microstrip pairs are preferably oriented with respect to one another such that the electromagnetic fields produces by each microstrip pair cancels the electromagnetic fields produced by the microstrip pairs they cross, e.g., are oriented perpendicular to one another, to reduce coupling between these microstrip pairs. Accordingly, increased isolation is achieved between microstrip pairs that cross.

BRIEF DESCRIPTION OF THE DRAWINGS

In the drawings, the same reference numerals are used to indicate the same elements.

DETAILED DESCRIPTION OF THE INVENTION

Figure 2:
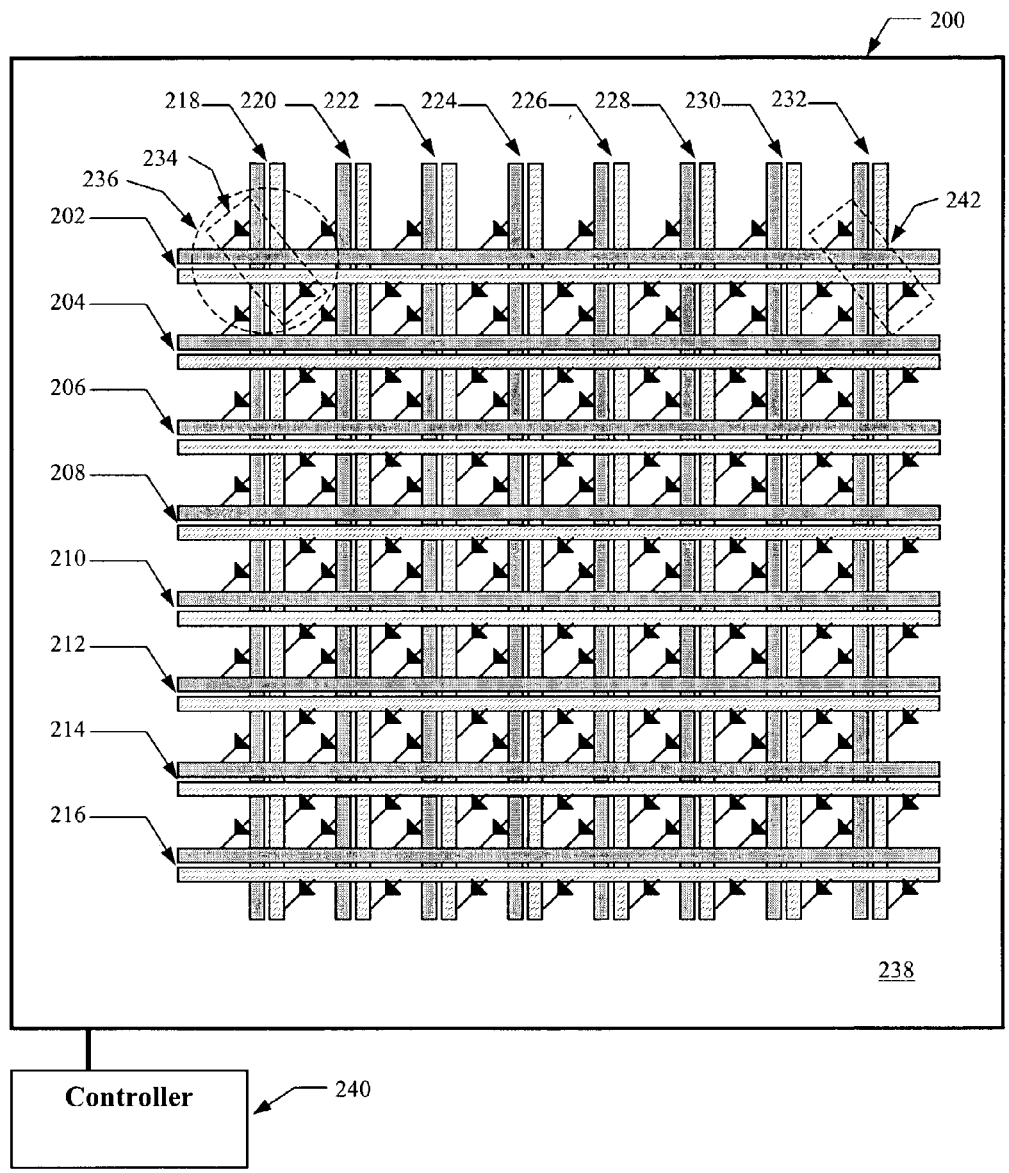
FIG. 2 is a circuit diagram of a switch matrix in accordance with the present invention.

FIG. 2 depicts an embodiment of a switch matrix 200 for routing electrical signals in accordance with the present invention. The switch matrix 200 includes microstrip pairs 202–232 and switch assemblies (represented by diode pairs in FIG. 2), e.g., switch assembly 234. Switch assemblies are associated with each point where one microstrip pair crosses another, e.g., cross point 236, for electrically coupling the microstrip pairs that cross at that cross point, e.g., microstrip pairs 202, 218.

In the illustrated embodiment, the microstrip pairs 202–232 are fabricated on a semiconductor substrate 238 in a grid pattern, e.g., an 8×8 grid. A first set of the microstrip pairs, i.e., microstrip pairs 202–216, have a first orientation (horizontal) and a second set of the microstrip pairs, i.e., microstrip pairs 218–232, have a second orientation (vertical). Each microstrip pair 202–232 includes a pair of microstrips substantially parallel to one another. Preferably, the first set of microstrip pairs is substantially perpendicular to the second set of microstrip pairs such that the microstrip pairs are perpendicular to one another at each cross point. By orienting the microstrip pairs in such a manner, the electromagnetic fields produces by each microstrip pair cancels the electromagnetic fields produced by the microstrip pairs they cross, thereby reducing coupling between the microstrip pairs at the cross points. Accordingly, increased isolation is achieved between the microstrip pairs at the cross points.

Figure 2A:
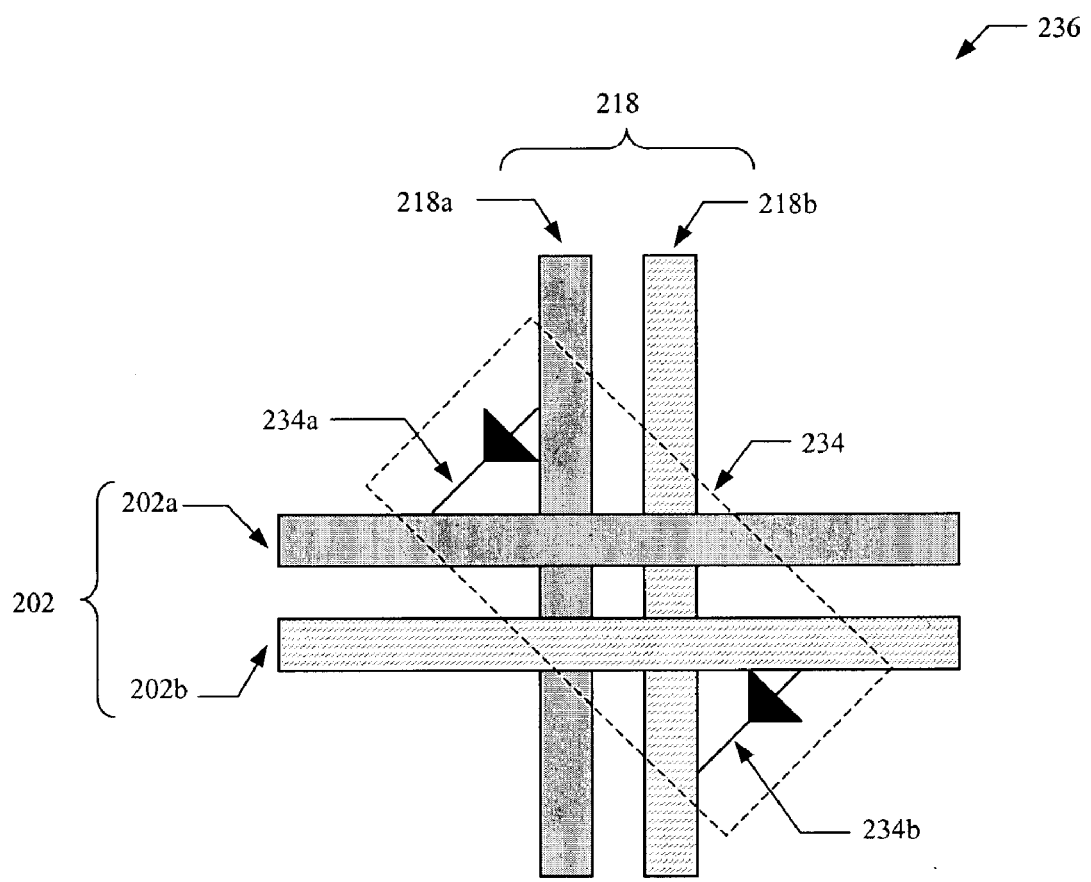
FIG. 2A is a circuit diagram of a cross point within the switch matrix of FIG. 2.

FIG. 2A is a detailed view of exemplary cross point 236 of FIG. 2. In the illustrated cross point, first microstrip pair 202 having a horizontal orientation crosses second microstrip pair 218 having a vertical orientation. The first microstrip pair 202 includes a first microstrip 202a and a second microstrip 202b substantially parallel to one another. The second microstrip pair 218 includes a first microstrip 218a and a second microstrip 218b substantially parallel to one another. The microstrip pairs 202, 218 are separated by a dielectric layer (not shown), e.g., an air or oxide layer. A switch assembly 234 is coupled between the microstrip pairs 202, 218. The switch assembly 234 includes a first switch 234a coupled between microstrip 202a and microstrip 218a and a second switch 234b coupled between microstrip 202b and microstrip 218b. When the switch assembly 234 is open, both switches 234a and 234b are open (i.e., neither switch conducting), thereby preventing coupling between the microstrip pair 202 and microstrip pair 218. When the switch assembly 234 is closed, both switches are closed (i.e., both switches conducting), thereby coupling microstrip pair 202 to microstrip pair 218, i.e., coupling microstrip 202a to microstrip 218a and coupling microstrip 202b to microstrip 218b.

When routing electrical signals, preferably, the electrical signal are introduced to the microstrip pairs such that the microstrip pairs through which the electrical signals pass are balanced. In a single unbalanced microstrip, the electrical signals passing through the microstrips produce electromagnetic fields that couple to the semiconductor substrate. In a balanced microstrip pair, the electromagnetic fields are concentrated primarily in the vicinity of a circular region centered around a midpoint between the two microstrips of the microstrip pair and perpendicular to the longitudinal axes of the microstrips, rather than being concentrated into the semiconductor substrate as in conventional unbalanced microstrips. This reduces coupling to the semiconductor substrate, thereby reducing signal losses attributable to the semiconductor substrate. Thus, acceptable levels of signal losses may be achieved using an inexpensive semiconductor substrate such as silicon. In the prior art, to achieve acceptable levels of signal losses, relatively expensive semiconductor substrates such as GaAs were required to reduce coupling between a microstrip and the substrate.

To balance a microstrip pair, such as microstrip pair 202, electrical signals are introduced to the pair in a manner that produces a first current in a first microstrip 202a that flows in a first direction and a second current in a second microstrip 202b that flows in an opposite direction. The first and second currents are equal in magnitude, but are 180 degrees out of phase. Since the currents are equal in magnitude and 180 degrees out of phase, the center between the two microstrips is a virtual ground. Thus, the electromagnetic fields produced by the microstrip pair 202 is minimized. By minimizing the electromagnetic fields, coupling is reduced between microstrip pairs at the cross point (e.g., between microstrip pair 202 and microstrip pair 218 when the switch assembly 234 is open) and between the microstrip pair and the semiconductor substrate. In a preferred embodiment, the electrical signal is a digital data signal made up of a series of high and low values. At any given instant, one microstrip of a microstrip pair has a high value and the other microstrip of the microstrip pair has a low value. A differential amplifier such as described below in reference to FIG. 3 may be used to introduce signals to a microstrip pair so that the microstrip pair is balanced. A detailed discussion of balanced lines is contained within U.S. patent application Ser. No. 10/116,091 filed on Apr. 3, 2002 entitled Bias Feed Network Arrangement for Balanced Lines having at least one common inventor and assigned to the same assignee as the present application, incorporated fully herein by reference.

Referring back to FIG. 2, a controller 240 is coupled to the switch matrix 200. The controller 240 is a conventional controller such as a digital signal processor (DSP), state machine, microprocessor, micro-controller, logic circuit, or essentially any device capable of processing electrical signals. Preferably, the controller 240 is coupled to the switch matrix via a differential amplifier such as the differential amplifier described below in reference to FIG. 3.

The controller 240 operates in a switching mode and in a signaling mode. In the switching mode, the controller 240 configures the switch matrix 200 by opening/closing individual switch assemblies to electrically couple select ones of the microstrip pairs, which is described in greater detail below. In the signaling mode, the controller 240 supplies electrical signals to the microstrip pairs for routing by the switch matrix 200 as configured during the switching mode.

For example, if, during the switching mode, the switch assembly 234 in the upper left hand corner of the switch matrix 200 is closed and a signal is applied to the first horizontal microstrip pair 202 during the signaling mode, the signal will be routed onto the first vertical microstrip pair 218. If a switch assembly 242 in the upper right hand corner is closed, the signal will be routed onto the last vertical microstrip pair 232. In a preferred embodiment, during the signaling mode, data supplied by the controller 240, e.g., through a differential amplifier, is introduced to the microstrip pairs such that those microstrip pairs are balanced.

Figure 3:
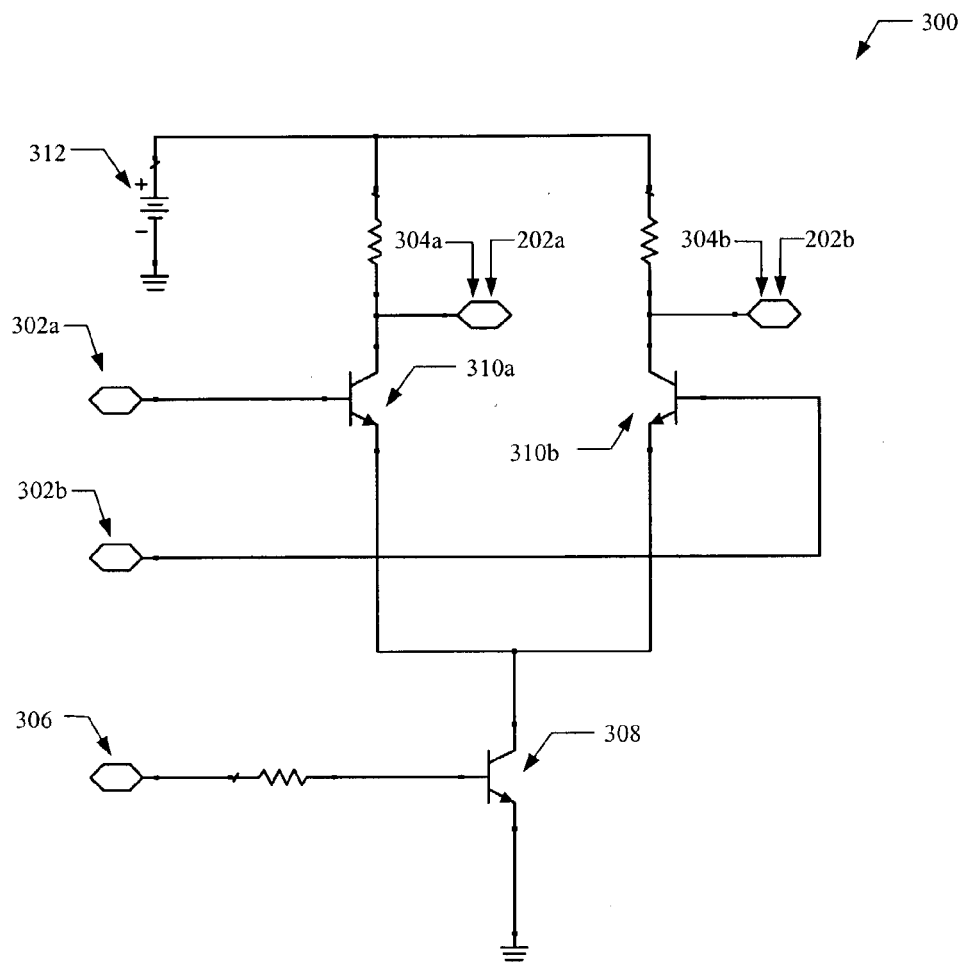
FIG. 3 is a circuit diagram of an amplifier for use in the switch matrix of FIG. 2.

FIG. 3 depicts an amplifier 300 for use with the switch matrix 200 of FIG. 2. Separate amplifiers 300 are preferably coupled between the controller 240 (FIG. 2) and each microstrip pair 202–232. In certain embodiments, amplifiers 300 are also coupled between each microstrip pair 202–232 and an output device(s) (not shown). Each amplifier 300 may be used to introduce gain to the data signals being routed by the switch matrix 200 and to provide impedance matching between the switch matrix 200 (FIG. 2) and the controller 240/output device(s) to which it is coupled.

The illustrated amplifier 300 includes a pair of input ports 302a and 302b, a pair of output ports 304a and 304b, and a control port 306. When coupled between the controller 240 (FIG.2) and a microstrip pair 202–232, the amplifier 300 is configured via the control port 306 (e.g., by the controller 240) to operate in either a data signaling mode or a switching mode. In a preferred embodiment, applying a first value, e.g., a low voltage value of less than about 0.2 V, to the control port 306 configures the amplifier 300 in a switching mode and applying a second value, e.g., a high voltage value greater than about 1.0 V, to the control port 306 configures the amplifier 300 in a signaling mode. When configured in a signaling mode, a differential signal applied between the pair of input ports 302a and 302b will be amplified and presented as an amplified differential signal between the pair of output ports 304a and 304b for introduction between the microstrips of a microstrip pair, e.g., microstrips 202a and 202b of microstrip pair 202. Preferably, the differential signal introduced between the microstrips results in a balanced microstrip pair as described in detail above. When configured in a switching mode, both output ports 304a and 304b will present a switch set value, e.g., a high value greater than about 3.0 V, to be placed on both of the microstrips of the microstrip pair, which, as will be described in detail below, is a necessary step for closing the switch assembly 234 (FIG. 2) using the control depicted in FIG. 5A.

The amplifier 300 includes a control transistor 308 for receiving the control signal for configuring the amplifier 300 in either the data signaling mode or the switching mode and a pair of transistor 310a and 310b having control ports for receiving the differential signal applied between the input ports 302a and 302b. The current flow terminals of each transistor of the transistor pair are coupled between a voltage source 312, e.g., a 3.0 V DC voltage source, and the current flow terminals of the control transistor 308. The amplifier 300 is configured in the signal mode by applying a high signal to the control transistor 308 via the control port, which turns on the control transistor to allow current flow through the pair of transistors 310a and 310b. In this mode, the amplifier 300 of FIG. 3 behaves as a conventional differential amplifier and a differential signal between the input ports 302a and 302b will be amplified and presented between the output ports 304a and 304b. The amplifier 300 is configured in the switching mode by applying a low signal to the control transistor 308 via the control port, which turns off the control transistor 308. In this mode, current is prevented from flowing through the pair of transistors 310a and 310b, which effectively turns off these transistors and results in a high value, e.g., the 3.0 V, from the voltage source 312, being presented at the pair of output ports 304a and 304b.

Figure 4:
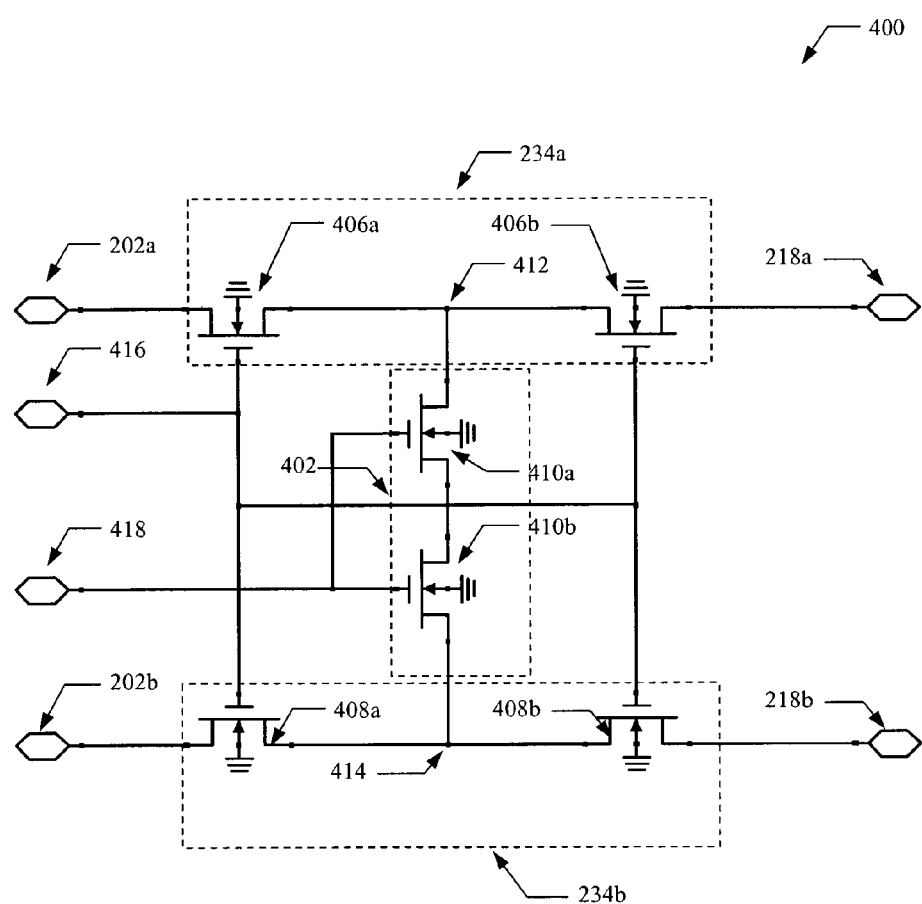
FIG. 4 is a circuit diagram of a switch for use in the switch matrix of FIG. 2.

FIG. 4 depicts a preferred cross point switch 400 for use in the switch assembly 234 of FIG. 2 to couple microstrip pairs at a cross point. The illustrated cross point switch 400 includes a first switch 234a for coupling a first microstrip 202a of a first microstrip pair 202 to a first microstrip 218a of a second microstrip pair 218, a second switch 234b for coupling a second microstrip 202b of the first microstrip pair 202 to a second microstrip 218b of the second microstrip pair 218, and a third switch 402 (an "isolation switch") for coupling the first and second switches 234a and 234b together when the first and second switches are open to improve isolation at the cross point.

The first switch 234a includes a first transistor 406a and a second transistor 406b coupled in series between microstrip 202a and microstrip 218a such that when both transistors are on these microstrips are coupled together through the transistors current flow terminals, e.g., the collector/emitter of a BJT or the drain/source of a FET. The second switch 234b includes a first transistor 408a and a second transistor 408b coupled in series between microstrip 202b and microstrip 218b such that when both transistors are on these microstrips are coupled together. The third switch 402 includes a first transistor 410a and a second transistor 410b coupled in series between the first and second switches 234a and 234b such that when both transistors are on a connection point 412 between the transistors of the first switch 234a is coupled to a connection point 414 between the transistors of the second switch 234b. All transistors can be turned on by supplying a switch value, e.g., a high voltage (and turned off by supplying a low voltage), to the control terminals of the transistors, i.e., the base of a BJT or the gate of a FET.

Figure 1:
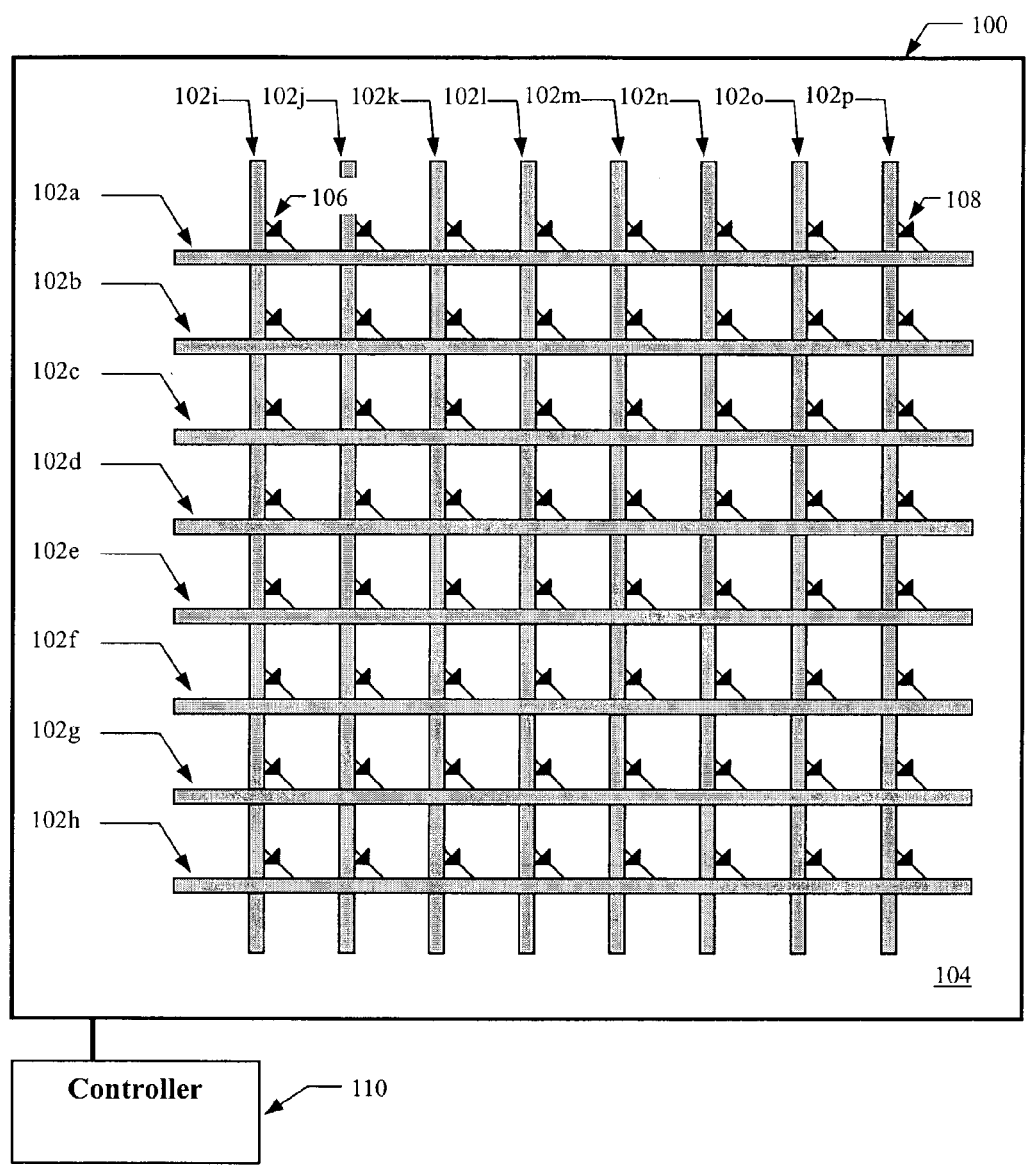
FIG. 1 is a circuit diagram of a prior art switch matrix.

In the illustrated embodiment, the control terminals of the transistors within the first and second switches 234a and 234b are coupled to a first switch port 416 and the control terminals of the transistors within the third switch 402 are coupled to a second switch port 418. The switch assembly 234 (FIG. 1) is closed when a high value is applied to the first switch port 416 (which turns on the transistors of the first and second switches 234a and 234b) and a low value is applied to the second switch port 418 (which turns off the transistors of the third switch 402). Conversely, the switch assembly 234 is open when a low value is applied to the first switch port 416 (transistors of switches 234a and 234b off) and a high value is applied to the second switch port 418 (transistors of switch 402 on). It will be readily apparent to those skilled in the art that the transistors of the third switch 402, which are on when the switch assembly 234 is open, will improve isolation between microstrip pairs (e.g., between microstrips 202 and 218) at the cross point when the switch assembly 234 is open.

Figure 5A:
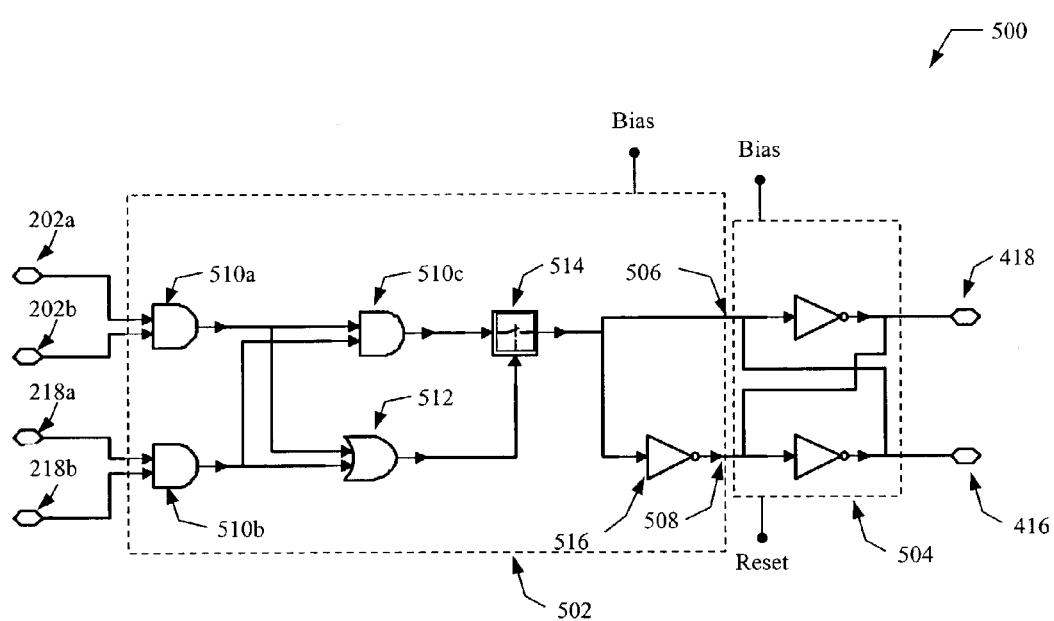
FIGS. 5A–5D are circuit diagrams of control circuits for use with the switch of FIG. 4.

FIG. 5A depicts one embodiment of a control circuit 500 for use in the switch assembly 234 of FIG. 2 to control the cross point switch 400 of FIG. 4. The illustrated control circuit 500 controls the values presented to the first and second switch ports 416, 418 of the cross point switch 400 in response to signal levels on the microstrips. In the illustrated embodiment, the control circuit 500 includes a logic circuit 502 and a latch 504. In a preferred embodiment, the switch assembly 234 is closed when the latch 504 is set. As will be described in detail below, the logic circuit 502 sets the latch 504, thereby closing the switch assembly 234 in response to specific signal levels on the microstrips, e.g., a high value on each of the microstrips associated with the switch assembly 234. The latch 504 may then be reset, thereby opening the switch assembly 234.

The logic circuit 502 is a conventional logic circuit for controlling the latch 504 in response to values present on the microstrips. In the illustrated embodiment, the logic circuit 502 initially presents a low value at a first output point 506 and a high value at a second output point 508. The logic circuit 502 will then present a high value at the first output point 506 and a low value at the second output point 508 in response to high values present on each of the microstrips. When a high value is removed from any one of the microstrips, the logic circuit 502 will present a low value at the first output point 506 and a high value at the second output point 508.

In the illustrated embodiment, a high value on each of the microstrips, which are coupled to the inputs of a first AND gate 510*a* and a second AND gate 510*b*, will produce a high value at the outputs of the first and second AND gates 510*a* and 510*b*. The outputs of the first and second AND gates 510*a* and 510*b* are coupled to the inputs of an OR gate 512 and the inputs of a third AND gate 510*c*, thereby causing high values at the outputs of the OR gate 512 and the third AND gate 510*c*. The high output from the OR gate 512 closes a conventional switch 514 (e.g., a transistor), which allows the high output from the third AND gate 510*c*, to pass through the switch 514 to the first output point 506. In addition, the high output passes through an inverter 516 to produce a low value at the second output point 508. If any one of the microstrips presents a low value, a low value passes to the first output point 506 and a high value passes to the second output point 508.

Initially, the latch 504 presents a low value at the first switch port 416 and a high value at the second switch port 418 (i.e., the switch assembly 234 will be open). When set, the latch 504 presents a high value at the first switch port 416 and a low value at the second switch port 418 (i.e., the switch assembly 234 will be closed). The latch is set in response to a high value at the first output point 506 of the logic circuit 502 and a low value at the second output point 508 of the logic circuit 502.

When reset, the latch 504 presents a low value at the first switch port 416 and a high value at the second switch port 418 (i.e., the switch assembly 234 will be open). In accordance with one embodiment, the latch 504 is a conventional latch that is reset in a known manner by supplying a reset signal to a reset port (RESET) common to such latches. In an alternative embodiment, the latch 504 is a conventional latch that is reset in a known manner by reducing a bias voltage applied to a bias port (BIAS) also common to such latches. In addition, the reset signal could be generated by a reset logic circuit (not shown) coupled to the microstrips, e.g., microstrips 202*a*, 202*b*, 218*a*, and 218*b*. For example, the reset logic circuit could be configured to reset the latch 504 in response to a low value on all microstrips coupled to the logic circuit.

In another alternative embodiment, the latch 504 is a conventional JK flip-flop that may be reset using the same values used to set the latch 504, i.e., a high value at the first output point 506 and a low value at the second output point 508. For example, a high value at a first output point 506 and a low value at a second output point 508 will set the latch 504 after the latch has been reset. Likewise, applying the same values to the latch after the latch has been set will reset the latch.

Referring to FIGS. 2, 3, 4, and 5A, in a preferred use, signals are applied to each of the microstrip pairs by a controller 240 (FIG. 2) via an amplifier 300 (FIG. 3). If the amplifier 300 is configured in a data signaling mode, e.g., by applying a high value to the control port 306 of the control transistor 308 of the amplifier 300, a differential signal across the input ports 302*a, b* of the amplifier 300 is amplified and presented at the output ports 304*a, b* of the amplifier 300 for passage onto the microstrips coupled to the output ports 304*a, b*. If the amplifier 300 is configured in a switching mode, e.g., by applying a low value to the control port 306 of the control transistor 308 of the amplifier 300, high values are presented at the output ports 304*a* and 304*b* of the amplifier 300 for passage onto the microstrips.

The controller 240 configures the switch matrix 200 for routing data signals by selectively controlling which of the switch assemblies are closed. A switch assembly is closed if the switches between the microstrip pairs coupled to the switch assembly are closed. For example, switch assembly 234 is closed if switches 234*a* and 234*b* are closed. If the switches 234*a* and 234*b* are open, these switches may be closed by applying high values to each microstrip for the microstrip pairs coupled to the switch assembly 234, e.g., microstrips 202*a*, 202*b*, 218*a*, and 218*b*. High values are applied to these microstrips by applying a low value to the control port 306 of each of the control transistors 308 of amplifiers 300 associated with the microstrip pairs 202 and 218. Applying high values to each of the microstrips prompts the logic circuit 502 (FIG. 5A) to be configured such that a high value is presented on the first switch port 416 and a low value is presented on the second switch port 418. The high value on the first switch port 416 and the low value on the second switch port 418 cause the switches 234*a* and 234*b* within the switch assembly 234 that are coupled between the microstrip pairs 202 and 218 to close, thereby coupling the first microstrip 202*a* of the first microstrip pair 202 to the first microstrip 218*a* of the second microstrip pair 218 and coupling the second microstrip 202*b* of the first microstrip pair 202 to the second microstrip 218*b* of the second microstrip pair 218. Switch assemblies that are closed may be opened using techniques such as those described above with reference to the logic circuit 502 of FIG. 5A.

The data signals are then routed by the switch matrix 200 as configured by the controller 240. For example, if the switch matrix 200 is configured such that switch assembly 234 is closed and a data signal is applied as a differential signal across microstrips 202*a, b*, that data signal will be routed to produce a differential signal across microstrips 218*a, b*.

Figure 5B:
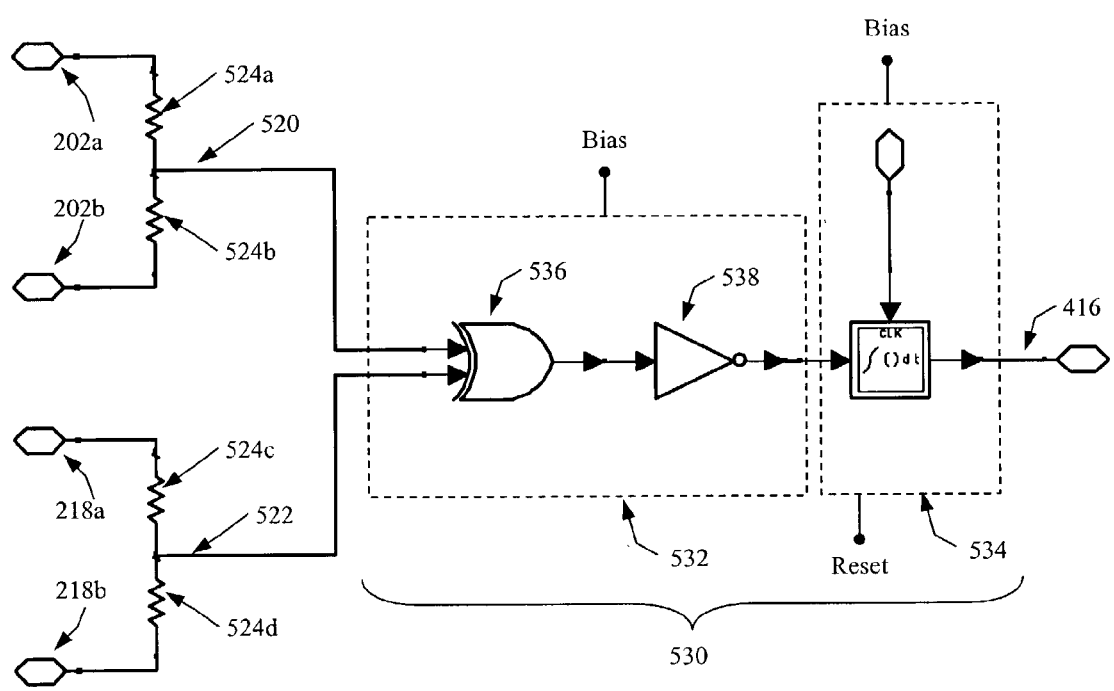
Figure 5C:
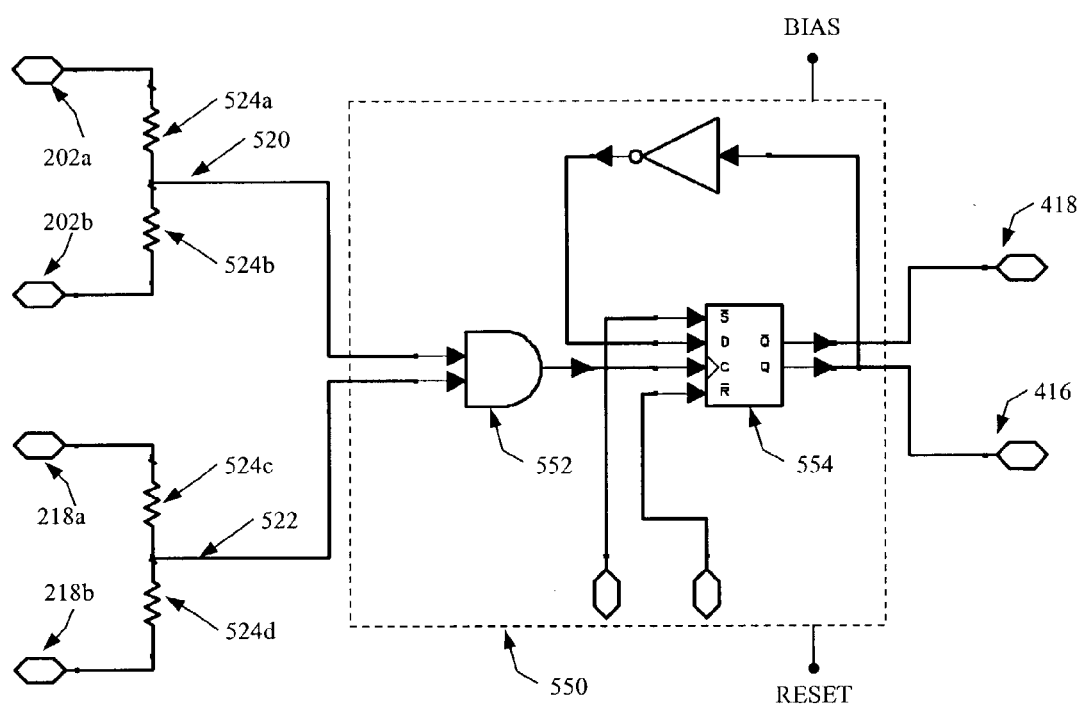
Figure 5D:
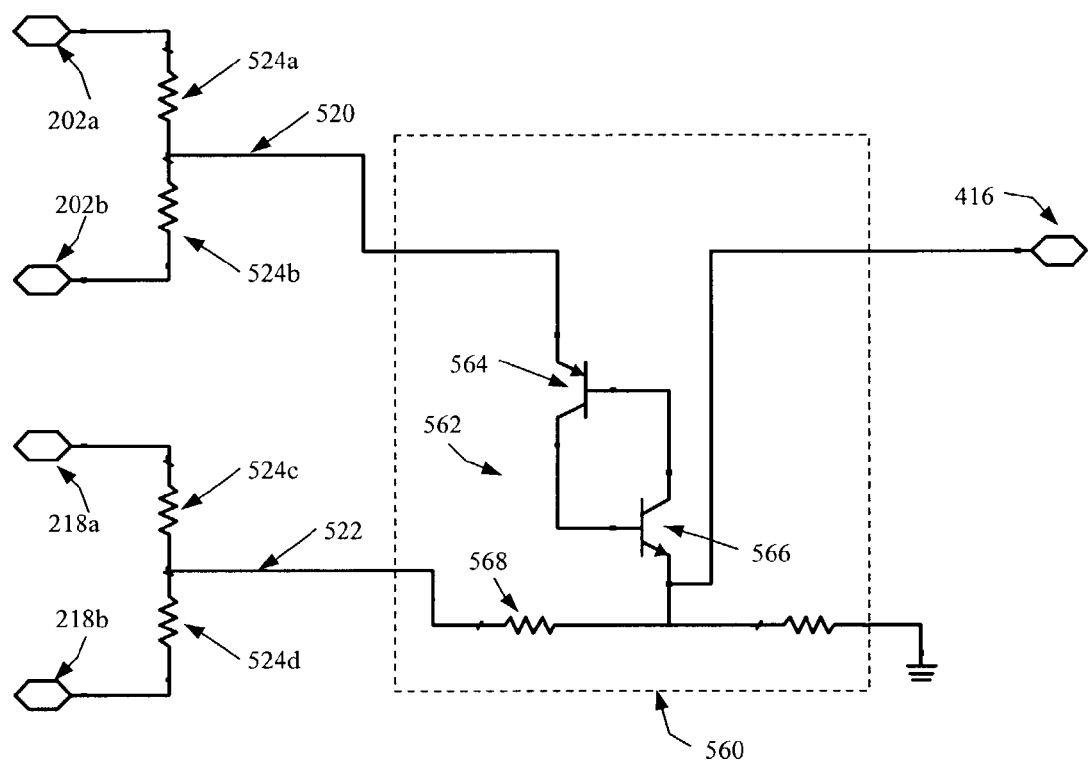

FIGS. 5B, 5C, and 5D depict alternative control circuits for controlling the cross point switch 400 of FIG. 4. These alternative control circuits, which are discussed in detail below, may be used to develop an output signal to set the voltage level at the first switch port 416 of the cross point switch 400. The development of a complementary output signal to set the voltage level at the second switch port 418 will be readily apparent to one of skill in the art.

Each of the control circuits depicted in FIGS. 5B, 5C, and 5D set the voltage level at the first switch port 416 based on a first tapped signal on a first tap line 520 developed from signals on a corresponding microstrip pair, e.g., microstrip pair 202, and a second tapped signal on a second tap line 522 developed from signals on a corresponding other microstrip pair, e.g., microstrip pair 218. In a preferred embodiment, each control line 520, 522 is located at the midpoint between its corresponding microstrip pair 202, 218. A first resistor 524a is coupled between a first microstrip 202a and the first tap line 520, a second resistor 524b is coupled between a second microstrip 202b and the first tap line 520, a third resistor 524c is coupled between a third microstrip 218a and the second tap line 522, and a fourth resistor 524d is coupled between a fourth microstrip 218b and the second tap line 522. Preferably, the resistors 524a–d are high-value resistors having a resistance that is greater than about 10 KOhms. When the microstrip pairs are balanced (e.g., during a data signaling after a switching mode), a virtual ground exists at the midpoint between the microstrips and, thus, no coupling will occur between the microstrip pairs and the corresponding tap line. Since no coupling occurs during data signaling, insertion losses attributed to the control circuit can be minimized. If the microstrips of a microstrip pair become unbalanced, RF coupling occurs between the microstrips of the microstrip pair and the corresponding tap line and, thus, a signal will be developed on the tap line. The development of signals needed on the microstrip pairs to develop the signals on the tap lines ("tapped signals") for controlling the control circuits depicted in FIGS. 5B, 5C, and 5D will be readily apparent to those skilled in the art.

FIG. 5B depicts an integrator control circuit 530. The illustrated integrator control circuit 530 includes a logic circuit 532 and an integrator 534. Preferably, the logic circuit 532 includes an exclusive OR gate 536 and an inverter 538, and the integrator 534 can be implemented using a shunt capacitor. The logic circuit 532 develops a scalar product of the tapped signals received on the first and second tap lines 520, 522 and the integrator 534 integrates the scalar product. If the tapped signals on the first and second tap lines are the same, the integrator 534 will produce a maximum output, e.g., 3.0 V, at the first switch port 416. When the maximum value is produced at the first switch port 416, the cross point switch 400 (FIG. 4) at the cross point of the microstrips 202, 218 is closed. At lower values, e.g., below 1.0 V, which will occur if the tapped signals are not the same, the cross point switch 400 is open. It will be readily apparent to those skilled in the art that if two or more cross point switches corresponding to two or more cross points are to be closed at the same time, one tapped signal may be developed by the microstrips corresponding to one of the cross points for closing switches at that cross point and another tapped signal may be developed by the microstrips corresponding to another one of the cross points for closing switches at that cross point.

In the illustrated integrator control circuit 530, the tapped signals on the first and second tap lines 520, 522 need to be applied continuously to keep the cross point switch 400 closed—even when using the switch matrix 200 to pass data signals. The signals on the tap lines can be applied during the passage of data signals by adding identical voltage level signals to each microstrip of a microstrip pair. Since data signals are passed along each microstrip pair as a differential signal, as long as the differential voltage between the microstrips remains unchanged, the integrity of the data signal can be preserved. Thus, the signals on the microstrip pairs used to create the tapped signals on the tap lines can "ride" on the same line as the data signals as long as the voltage levels on both microstrips of a microstrip pair move up and down at the same time. Additionally, different frequencies can be used for the control signals and for the data signals to further increase the separation of these signals.

FIG. 5C depicts a logic control circuit 550. The illustrated logic control circuit 550 includes an AND gate 552 and a conventional toggle flip-flop 554. A first input of the AND gate 552 is coupled to a first tap line 520 to receive a first tapped signal and a second input of the AND gate is coupled to a second tap line 522 to receive a second tapped signal. An output of the AND gate is coupled to the clock port (CLK) of the flip-flop 554. The output (Q) of the flip-flop 554 is coupled to the first switch port 416. The values of the first and second tapped signals at the inputs of the AND gate and the output of the flip-flop 554 are initially low, which results in an open corresponding cross point switch 400 (FIG. 4). When a high tapped signal value, e.g., greater than 3.0 V, is received at both inputs of the AND gate 552, the output of the AND gate 552 transitions from low to high, which, in turn, toggles the output (Q) of the flip-flop 554 from low to high, thereby closing the corresponding cross point switch. The tapped signals at the inputs of the AND gate 552 are then set low and the closed cross point switch may be used to pass data signals. When another high tapped signal value is subsequently received at both inputs of the AND gate 552, the output of the AND gate 552 transitions from low to high, which, in turn, toggles the output of the flip-flop 554 from high to low, thereby opening the corresponding cross point switch which ceases the data signal transmission.

FIG. 5D depicts a thyristor control circuit 560. The thyristor control circuit 560 includes a conventional thyristor 562, which includes a first transistor 564 and a second transistor 566. The emitter of the first transistor 564 is coupled to the first tap line 520 to receive a first tapped signal and the emitter of the second transistor 566 is coupled to the second tap line 522 through a resistor 568 to receive a second tapped signal. The emitter of the second transistor 566 is also coupled to the first switch port 416 for controlling a corresponding cross point switch 400 (FIG. 4). Applying a voltage across the thyristor 562, e.g., between the emitter of the first transistor 564 and the emitter of the second transistor 566, that exceeds the breakdown voltage of the thyristor 562, turns on the thyristor 562, which, in turn, produces a high value at the first switch port 416 to close the corresponding cross point switch. The thyristor will remain on as long as a "hold-on" current flows through the thyristor 560 between the emitter of the first transistor 564 and the collector of the second transistor 566. It will be readily apparent to one skilled in the art that the hold-on current may be supplied to the thyristor 560 in a manner similar to the switching signals applied to the integrator control circuit 530 of FIG. 5B. Reducing the current flowing through the thyristor 560 below the hold-on current, turns off the thyristor, which, in turn, produces a low value at the first switch port 416 to open the corresponding cross point switch.

Figure 6A:
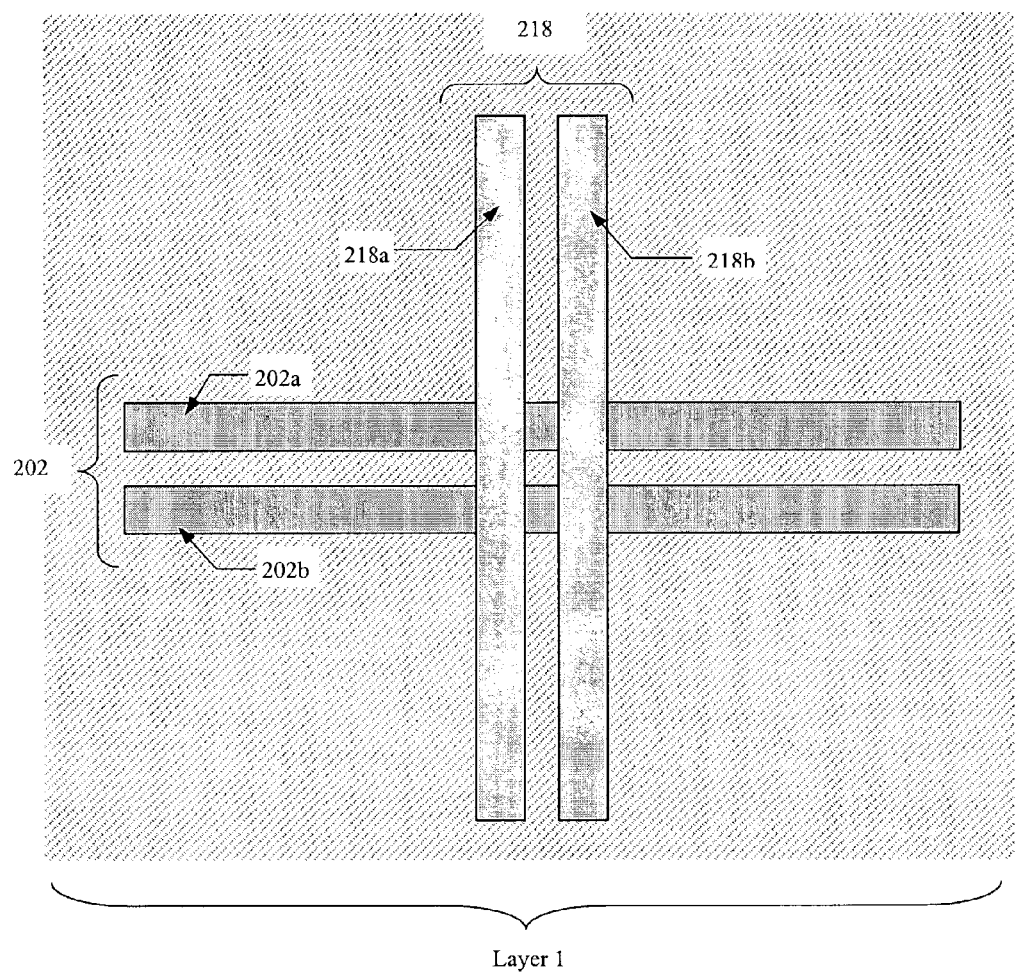
FIG. 6A is a circuit diagram illustrating microstrip pairs in a first layer deposited on a semiconductor substrate in the switch matrix of FIG. 2.
Figure 6B:
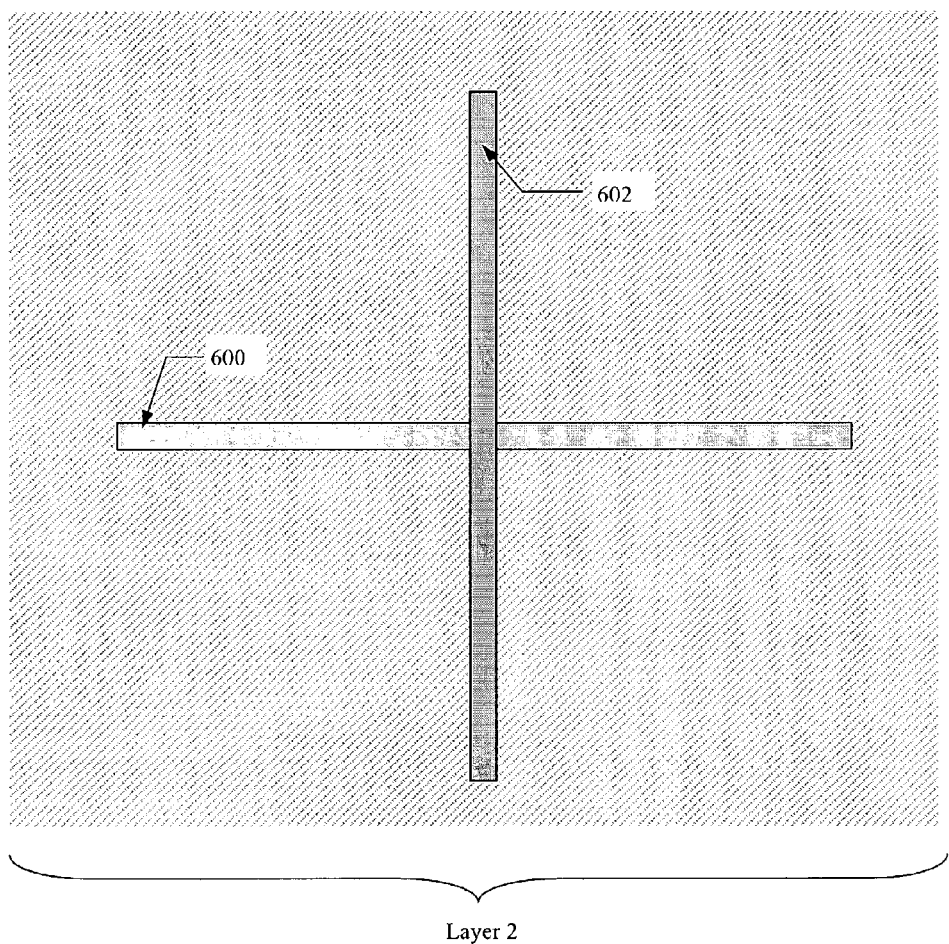
FIG. 6B is a circuit diagram illustrating bias lines in a second layer deposited on a semiconductor substrate in the switch matrix of FIG. 2.

FIGS. 6A and 6B depict a preferred method for routing of biasing lines within the switch matrix 200 of FIG. 2. The biasing lines may be used to bias the components of the switches. For example, bias lines may be used to bias the logic circuits 502, 504 and switches 234a, 234b, 402 depicted in FIG. 4. Preferably, as depicted in FIG. 6A, the microstrip pairs, e.g., microstrip pairs 202 and 218, of the switch matrix 200 are located in one layer (e.g., layer 1) and, as depicted in FIG. 6B, the biasing lines, such as biasing lines 600 and 602, are located in another layer (e.g., layer 2) to facilitate fabrication and maintain electrical isolation between the microstrips and the biasing lines. In the illustrated embodiment, the first bias line 600 (FIG. 6B) is positioned between a first microstrip 202a and a second microstrip 202b of a first microstrip pair 202 (FIG. 6A) and a second bias line 602 (FIG. 6B) is positioned between a first microstrip 218a and a second microstrip 218b of a second microstrip pair 218 (FIG. 6A). If the microstrips flanking the bias line are balanced, as described above, a virtual ground will exist at the midpoint between the microstrips. Accordingly, since the bias line is located at a virtual ground, coupling between the microstrips and the bias line is minimized.

Simulations

Figure 7A:
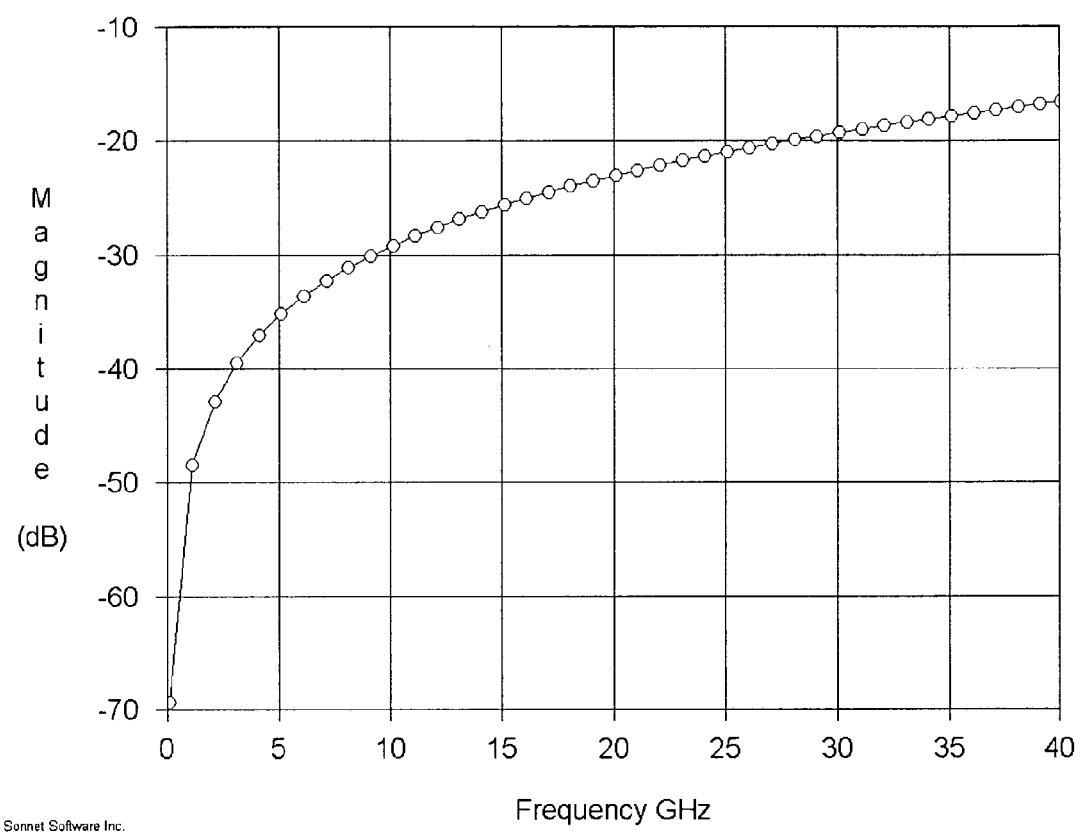
FIG. 7A is a graph depicting simulation results of the line-to-line isolation for a prior art cross point.

FIG. 7A is a graph illustrating the coupling characteristics of a simulated cross point between conventional microstrips in decibels (dB) for frequencies between 0 and 40 Gigahertz. The simulation was rendered in Sonnet® (a computer software program well known to those of skill in the art that enables the simulation of electromagnetic fields) using 25 micrometer microstrips, e.g., microstrip 102a and microstrip 102i (FIG. 1), over a 100 micrometer GaAs substrate. As can be seen, using the prior art microstrip configuration, at 25 Gigahertz, the coupling is approximately −20 dB.

Figure 7B:
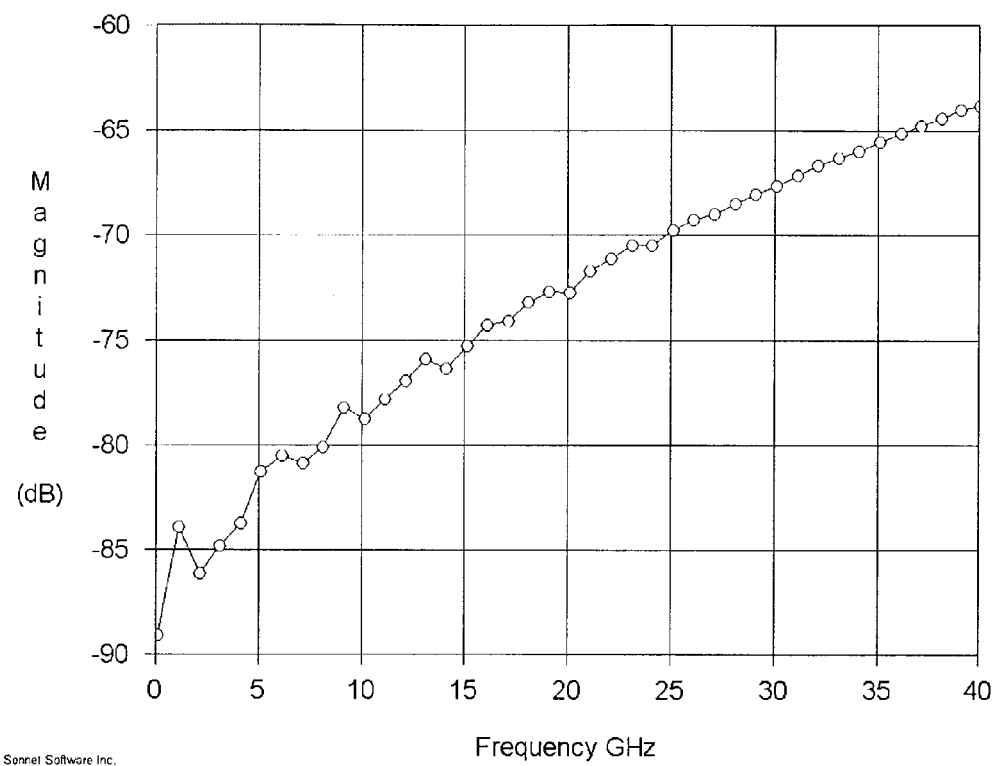
FIG. 7B is a graph depicting simulation results or the line-to-line isolation for a cross point in accordance with the present invention.

FIG. 7B is a graph illustrating the coupling characteristics of a simulated cross point between balanced microstrip pairs in accordance with the present invention for frequencies between 0 and 40 Gigahertz. The simulation was also rendered in Sonnet® using 25 micrometer microstrips, e.g., microstrips 202a and 202b and microstrips 218a and 218b (FIG. 2A), over a 250 micrometer silicon substrate. The bulk resistivity is 20 Ohms-cm. As can be seen, at 25 Gigahertz, the coupling is approximately −70 dB. Accordingly, much better isolation is achieved than in the conventional approach.

Having thus described a few particular embodiments of the invention, various alterations, modifications, and improvements will readily occur to those skilled in the art. For example, although an 8×8 switch matrix is illustrated, the present invention may be employed in a switch matrix of essentially any size. Such alterations, modifications, and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. A switch matrix apparatus comprising:
   one or more microstrip pairs of a first orientation;
   one or more microstrip pairs of a second orientation each of which crosses said one or more microstrip pairs of said first orientation at cross points, each of said cross points corresponding to the crossing of one of said microstrip pairs of said first orientation with one of said microstrip pairs of said second orientation; and
   one or more switch assemblies, each switch assembly associated with one of said cross points; and
   a controller coupled to said one or more switch assemblies for closing individual ones of said switch assemblies to couple selected ones of said one or more microstrip pairs of said first orientation to said one or more microstrip pairs of said second orientation, said controller actuating said one or more switch assemblies based on tapped signals developed from signals on said one or more microstrip pairs.

2. The apparatus of claim 1, further comprising:
   a semiconductor substrate on which said microstrip pairs of said first and second orientations are fabricated, said semiconductor substrate being silicon.

3. The apparatus of claim 1, wherein each of said one or more microstrip pairs of said first orientation comprises at least a first microstrip and a second microstrip substantially parallel to said first microstrip and wherein each of said microstrip pairs of said second orientation comprises at least a third microstrip and a fourth microstrip substantially parallel to said third microstrip.

4. The apparatus of claim 3, wherein each of said one or more switch assemblies associated with one of said cross points comprises at least:
   a first switch coupled between said first microstrip and said third microstrip; and
   a second switch coupled between said second microstrip and said fourth microstrip.

5. The apparatus of claim 4, wherein each of said one or more switch assemblies further comprises at least a logic circuit for actuating said first and second switches, said logic circuit having inputs coupled to said first, second, third, and fourth microstrips and outputs coupled to said first and second switches, said logic circuit closing said first and second switches when a switch signal is received on said first, second, third, and fourth microstrips.

6. The apparatus of claim 4, wherein each of said one or more switch assemblies further comprises at least a logic circuit for actuating said first and second switches, said logic circuit having a first input coupled to a first tap line positioned between said first and second microstrips and a second input coupled to a second tap line positioned between said third and fourth microstrips, said logic circuit closing said first and second switches when a first tapped signal is developed on said first tap line by signals on said first and second microstrips and a second tapped signal is developed on said second tap line by signals on said third and fourth microstrips.

7. The apparatus of claim 6, wherein said first tap line is positioned at a first midpoint between said first and second microstrips and said second tap line is positioned at a second midpoint between said third and fourth microstrips, wherein said first and second tapped signals are RF signals developed on said first and second tap lines during switching, and wherein, after switching, said first midpoint is a virtual ground between said first and second microstrips and said second midpoint is a virtual ground between said third and fourth microstrips.

8. The apparatus of claim 4, wherein each of said one or more switch assemblies further comprises at least a logic circuit and an integrator for actuating said first and second switches, said logic circuit having a first input coupled to a first tap line positioned between said first and second microstrips and a second input coupled to a second tap line positioned between said third and fourth microstrips, said logic circuit producing a scalar product of a first tapped signal developed on said first tap line by signals on said first and second microstrips and a second tapped signal developed on said second tap line by signals on said third and fourth microstrips, said first and second switches being closed based on an integration of said scalar product.

9. The apparatus of claim 8, wherein said first tap line is positioned at a first midpoint between said first and second microstrips and said second tap line is positioned at a second midpoint between said third and fourth microstrips, wherein said first and second tapped signals are RF signals developed on said first and second microstrips during switching, and wherein, after switching, said first midpoint is a virtual ground between said first and second microstrips and said second midpoint is a virtual ground between said third and fourth microstrips.

10. The apparatus of claim 4, wherein each of said one or more switch assemblies further comprises at least a thyristor having a breakdown voltage for actuating said first and second switches, said thyristor having a first input coupled to a first tap line positioned between said first and second microstrips and a second input coupled to a second tap line positioned between said third and fourth microstrips, said thyristor closing said first and second switches when a differential voltage between said first and second inputs exceeds said breakdown voltage.

11. The apparatus of claim 3, further comprising:
an amplifier having a switch port coupled to said controller and output ports coupled to said first and second microstrips, said amplifier producing a switch set value on each of said first and second microstrips when a switch value is present on said switch port.

12. The apparatus of claim 1, wherein each of said one or more microstrip pairs of said first and second orientation comprises at least:
a first microstrip; and
a second microstrip substantially parallel to said first microstrip;
wherein, during signal routing by said switch matrix, when a first signal is passed on said first microstrip of one of said microstrip pairs, a second signal is passed on said second microstrip of said one of said micro strip pairs such that said one of said microstrip pairs is balanced.

13. The apparatus of claim 12, wherein said first microstrip produces a first electromagnetic force when said first signal passes through said first microstrip and said second microstrip produces a second electromagnetic force when said second signal passes through said second microstrip, the electromagnetic forces produced by each of said first and second microstrips at least partially canceling the electromagnetic forces produced by the other.

14. A switch matrix comprising:
a plurality of microstrip pairs, wherein a first of said microstrip pairs crosses a second of said microstrip pairs at a cross point; and
a switch assembly associated with said cross point for coupling said first microstrip pair to said second microstrip pair, said switch assembly being actuated based on tapped signals developed from signals on said first and second microstrip pairs.

15. The switch matrix of claim 14, further comprising:
a semiconductor substrate on which said plurality of microstrip pairs are fabricated, said semiconductor substrate being silicon.

16. The switch matrix of claim 14, wherein each of said plurality of microstrip pairs comprises at least:
a first microstrip; and
a second microstrip substantially parallel to said first microstrip;
wherein, during signal routing by said switch matrix, when a first signal is passed on said first microstrip of one of said plurality of microstrip pairs, a second signal is passed on said second microstrip of said one of said plurality of microstrip pairs such that said one of said plurality of microstrip pairs is balanced.

17. The apparatus of claim 16, wherein said first microstrip produces a first electromagnetic force when said first signal passes through said first microstrip and said second microstrip produces a second electromagnetic force when said second signal passes through said second microstrip, the electromagnetic forces produced by each of said first and second microstrips at least partially canceling the electromagnetic forces produced by the other.

18. The switch matrix of claim 14, wherein said first microstrip pair comprises at least a first microstrip and a second microstrip substantially parallel to said first microstrip and wherein said second microstrip pair comprises at least a third microstrip and a fourth microstrip substantially parallel to said third microstrip.

19. The switch matrix of claim 18, wherein said switch assembly comprises at least:
a first switch coupled between said first microstrip and said third microstrip; and
a second switch coupled between said second microstrip and said fourth microstrip.

20. The switch matrix of claim 19, further comprising at least:
a control coupled to said first, second, third, and fourth microstrips for closing said first and second switches.

21. The switch matrix of claim 19, wherein said switch assembly further comprises a logic circuit for actuating said first and second switches, said logic circuit having inputs coupled to said first, second, third, and fourth microstrips and outputs coupled to said first and second switches, said logic circuit closing said first and second switches when a switch value is received on said first, second, third, and fourth microstrips.

22. The switch matrix of claim 21, further comprising a control coupled to said first and second microstrips for supplying said switch value to said first and second microstrips.

23. The switch matrix of claim 22, further comprising an amplifier coupled between said control and said first and second microstrips, said amplifier comprising a differential input configured to receive a differential signal from said controller, a switching input configured to receive a switch set value from said controller, a first amplifier output coupled to said first microstrip, and a second amplifier output coupled to said second microstrip, wherein, when said switch set value is at a first level, said amplifier presents an amplified version of said differential signal between said first and second amplifier outputs and, when said switch set value is at a second level, a switch value is presented at said first and second amplifier outputs.

24. The switch matrix of claim 19, wherein said switch assembly further comprises at least a logic circuit for actuating said first and second switches, said logic circuit having a first input coupled to a first tap line positioned between said first and second microstrips and a second input coupled to a second tap line positioned between said third and fourth microstrips, said logic circuit closing said first and second switches when a first tapped signal is developed on said first tap line by signals on said first and second microstrips and a second tapped signal is developed on said second tap line by signals on said third and fourth microstrips.

25. The switch matrix of claim 24, wherein said first tap line is positioned at a first midpoint between said first and second microstrips and said second tap line is positioned at a second midpoint between said third and fourth microstrips, wherein said first and second tapped signals are RF signals developed on said first and second tap lines during switching, and wherein, after switching, said first midpoint is a virtual ground between said first and second microstrips and said second midpoint is a virtual ground between said third and fourth microstrips.

26. The switch matrix of claim 19, wherein said switch assembly further comprises at least a logic circuit and an integrator for actuating said first and second switches, said logic circuit having a first input coupled to a first tap line positioned between said first and second microstrips and a second input coupled to a second tap line positioned between said third and fourth microstrips, said logic circuit producing a scalar product of a first tapped signal developed on said first tap line by signals on said first and second microstrips and a second tapped signal developed on said second tap line by said third and fourth microstrips, said first and second switches being closed based on an integration of said scalar product.

27. The switch matrix of claim 26, wherein said first tap line is positioned at a first midpoint between said first and second microstrips and said second tap line is positioned at a second midpoint between said third and fourth microstrips, wherein said first and second tapped signals are RF signals developed on said first and second tap lines during switching, and wherein, after switching, said first midpoint is a virtual ground between said first and second microstrips and said second midpoint is a virtual ground between said third and fourth microstrips.

28. The switch matrix of claim 19, wherein said switch assembly further comprises at least a thyristor having a breakdown voltage for actuating said first and second switches, said thyristor having a first input coupled to a first tap line positioned between said first and second microstrips and a second input coupled to a second tap line positioned between said third and fourth microstrips, said thyristor closing said first and second switches when a differential voltage between said first and second inputs exceeds said breakdown voltage.

29. The switch matrix of claim 14, wherein said switch assembly comprises at least:
 a first switch including a pair of transistors having current flow terminals coupled in series between said first and third microstrips and a control terminal for receiving a first control signal;
 a second switch including a pair of transistors having current flow terminals coupled in series between said second and fourth microstrips and a control terminal for receiving said first control signal; and
 a third switch including a pair of transistors having current flow terminals coupled in series between said first and second switches and a control terminal for receiving a second control signal.

30. The switch matrix of claim 29, wherein said switch further comprises at least:
 a logic circuit for producing said first and second control signals, said logic circuit having input ports coupled to said first, second, third, and fourth microstrips, said logic circuit producing said first and second control signals based on signal levels on said first, second, third, and fourth microstrips.

31. A method for routing electrical signals, said method comprising the steps of:
 configuring a switch matrix having at least a first microstrip pair, a second microstrip pair crossing said first microstrip pair at a cross point, and a switch assembly coupled between said first and second microstrip pairs such that said switch assembly is closed; and
 applying a first differential signal across said first microstrip pair, said first differential signal passing through said switch assembly to said second microstrip pair, said switch assembly being actuated based on tapped signals developed from signals on said first and second microstrip pairs.

32. The method of claim 31, wherein said first micro strip pair comprises a first microstrip and a second microstrip, said second microstrip pair comprises a third microstrip and a fourth microstrip, and said switch assembly, when closed, couples said first and third microstrips together and couples said second and fourth microstrips together; and
 wherein said configuring step comprise supplying switch values to said first, second, third, and fourth microstrips.

33. The method of claim 32, wherein said configuring step comprises at least the steps of:
 supplying a first value to a control terminal of a first amplifier, said first amplifier having outputs coupled to said first and second microstrips;
 supplying the first value to a control terminal of a second amplifier, said second amplifier having outputs coupled to said third and fourth microstrips;
 producing a switch value at said first, second, third, and fourth microstrips in response to said first value at the control terminals of said first and second amplifiers; and
 closing said switch in response to said switch value being received on said first, second, third, and fourth microstrips.

34. The method of claim 33, wherein said applying step comprises:
 supplying a second value to the control terminal of said first amplifier, said first amplifier further having a differential input;
 applying a second differential signal across said differential input;
 producing said first differential signal between said first and second microstrips in response to said second differential signal; and
 passing said first differential signal between said first and second microstrips to between said third and fourth microstrips if said switch is closed.

35. The method of claim 32, wherein said configuring step comprises at least the steps of:
 developing a first RF tapped signal on a first tap line positioned between said first and second microstrips, said first RF tapped signal developed from said switching values on said first and second microstrips;
 developing a second RF tapped signal on a second tap line positioned between said third and fourth microstrips, said second RF tapped signal developed from said switching values on said third and fourth microstrips; and
 configuring said switch assembly based on said first and second RF tapped signals.

* * * * *